United States Patent
Fukano et al.

(10) Patent No.: US 8,339,035 B2
(45) Date of Patent: Dec. 25, 2012

(54) ORGANIC EL MODULE AND ILLUMINATION DEVICE INCLUDING SAME

(75) Inventors: Satoshi Fukano, Ikoma (JP); Hideharu Kawachi, Kobe (JP); Shigetsugu Sumiyama, Hirakata (JP)

(73) Assignee: Panasonic Corporation, Osaka (JP)

( * ) Notice: Subject to any disclaimer, the term of this patent is extended or adjusted under 35 U.S.C. 154(b) by 39 days.

(21) Appl. No.: 13/081,611

(22) Filed: Apr. 7, 2011

(65) Prior Publication Data

US 2011/0248627 A1    Oct. 13, 2011

(30) Foreign Application Priority Data

Apr. 7, 2010   (JP) .................................. 2010-088752

(51) Int. Cl.
*H01J 1/62*    (2006.01)
*H01J 63/04*    (2006.01)

(52) U.S. Cl. ........ 313/504; 313/483; 313/498; 313/500; 313/501; 313/502; 313/503; 313/505; 313/506

(58) Field of Classification Search ........................ None
See application file for complete search history.

(56) References Cited

FOREIGN PATENT DOCUMENTS

| JP | 2003-257617 | | 9/2003 |
|---|---|---|---|
| JP | 2003257617 A | * | 9/2003 |

OTHER PUBLICATIONS

English machine translation of JP 2003-257617 (Sekiya).*

* cited by examiner

*Primary Examiner* — Natalie Walford
(74) *Attorney, Agent, or Firm* — Bacon & Thomas, PLLC

(57) ABSTRACT

An organic EL light emitting module includes an organic EL light emitting panel 5 including an organic EL light emitting unit 52 formed on a substrate 51 and electrode terminals 53 for supplying power to the organic EL light emitting unit 52; a circuit substrate 3, electrically connected to the electrode terminals 53, for supplying power to the electrode terminals 53; and a casing 4 to which the organic EL light emitting panel 5 and the circuit substrate 3 are attached. The electrode terminals 53 are disposed at left and right end portions of the organic EL light emitting panel 5 having a substantially rectangular shape when viewed from the top, and extended portions 4a protruding by a predetermined width are formed at side surfaces of the casing 4 where the electrode terminals 53 of the organic EL light emitting panel 5 are absent.

11 Claims, 11 Drawing Sheets

ORGANIC EL MODULE AND ILLUMINATION DEVICE INCLUDING SAME

FIELD OF THE INVENTION

The present invention relates to an organic electroluminescence (EL) module having a light emitting unit using an organic EL light emitting device.

BACKGROUND OF THE INVENTION

Conventionally, there has been known an organic EL panel (see, e.g., Japanese Patent Application Publication No. 2003-257617) having as a light source a thin-type organic EL light emitting device with high brightness and a wide viewing angle. The organic EL panel is formed by laminating, on a transparent glass substrate, an anode electrode layer that is a transparent electrode made of ITO (Indium Tin Oxide) or the like, a light emitting layer made of an organic compound, and a cathode electrode layer that is a metal electrode. In the organic EL panel described in Japanese Patent Application Publication No. 2003-257617, a solution containing an organic EL material is sprayed on a rectangular substrate, and an organic EL substrate on which a group of organic EL devices is arranged in a matrix shape is manufactured. Further, each angled portion of the substrate is chamfered.

This organic EL panel generates excitons of organic compounds included in the light emitting layer by applying a DC voltage from a constant current source to electrode terminals electrically connected to the anode electrode layer and the cathode electrode layer, and extracts light emitted when the excitons return to a ground state to the outside.

Recently, there has been known a module which is formed by accommodating in a casing a combined structure of an organic EL panel and a circuit substrate having power supply elements such as a power distribution pattern and the like in order to easily handle an extremely thin organic EL panel or facilitate supply of power from the outside, or an illumination device having a plurality of such modules.

However, in the conventional organic EL panel, the electrode terminals for supplying power to the organic EL panel are provided near main sides of the substrate. Therefore, when an operator handles the organic EL panel, wirings are damaged by an operator's contact with the electrode terminals.

In the organic EL panel described in Japanese Patent Application Publication No. 2003-257617, cutoff portions are formed at the substrate in order to provide direction in handling the substrate. However, when an operator handles the substrate or the casing accommodating the substrate or arranges a plurality of organic EL panels in an illumination device, the circumference of the substrate where the electrode terminals are disposed may be held by the operator, which may cause damages to the wirings connected to the electrode terminals.

Moreover, an operator may directly hold the organic EL panel, so that the surface of the organic EL panel may be contaminated with fingerprints.

SUMMARY OF THE INVENTION

In view of the above, the present invention provides an organic EL module capable of reducing damages to electrode wirings provided at an organic EL panel during operation such as an operator's handling of the organic EL panel or the like and also capable of reducing contamination of the organic EL panel. In addition, the present invention provides an illumination device having a plurality of organic EL modules.

In accordance with an aspect of the present invention, there is provided an organic EL light emitting module including: an organic EL light emitting panel including an organic EL light emitting unit formed on a substrate and electrode terminals for supplying power to the organic EL light emitting unit; a circuit substrate, electrically connected to the electrode terminals, for supplying power to the electrode terminals; and a casing to which the organic EL light emitting panel and the circuit substrate are attached, wherein the electrode terminals are disposed at left and right end portions of the organic EL light emitting panel having a substantially rectangular shape when viewed from the top, and extended portions protruding by a predetermined width are at least partially formed at side surfaces of the casing where the electrode terminals of the organic EL light emitting panel are absent.

Further, the extended portions formed at the casing may make the organic EL light emitting module have a substantially square shape when viewed from the top.

Each of the extended portions may be formed at a central portion or both end portions of each of the side surfaces of the casing, and a length of the extended portions along a side of the organic EL light emitting panel may be shorter than an entire length of the side of the organic EL light emitting panel.

A cutoff portion may be provided at one or more corner portions of the light emitting panel.

In accordance with another aspect of the present invention, there is provided an illumination device including a plurality of the light emitting modules described above.

With the organic EL module described above, the extended portions protruding by a predetermined width are at least partially formed at the side surfaces of the casing where the electrode terminals of the organic EL panel are not disposed, and the extended portions can serve as handle portions for an operator. Accordingly, it becomes easier for the operator to hold the extended portions when handling the organic EL module of the present invention. Hence, the wirings can be prevented from damages which would be caused when the operator holds the vicinity of the electrode terminals, and the organic EL panel can be protected from contamination by fingerprints or the like. Further, the extended portions can facilitate positioning of a plurality of organic EL modules when the organic EL modules are arranged in the illumination device.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Figure 1:
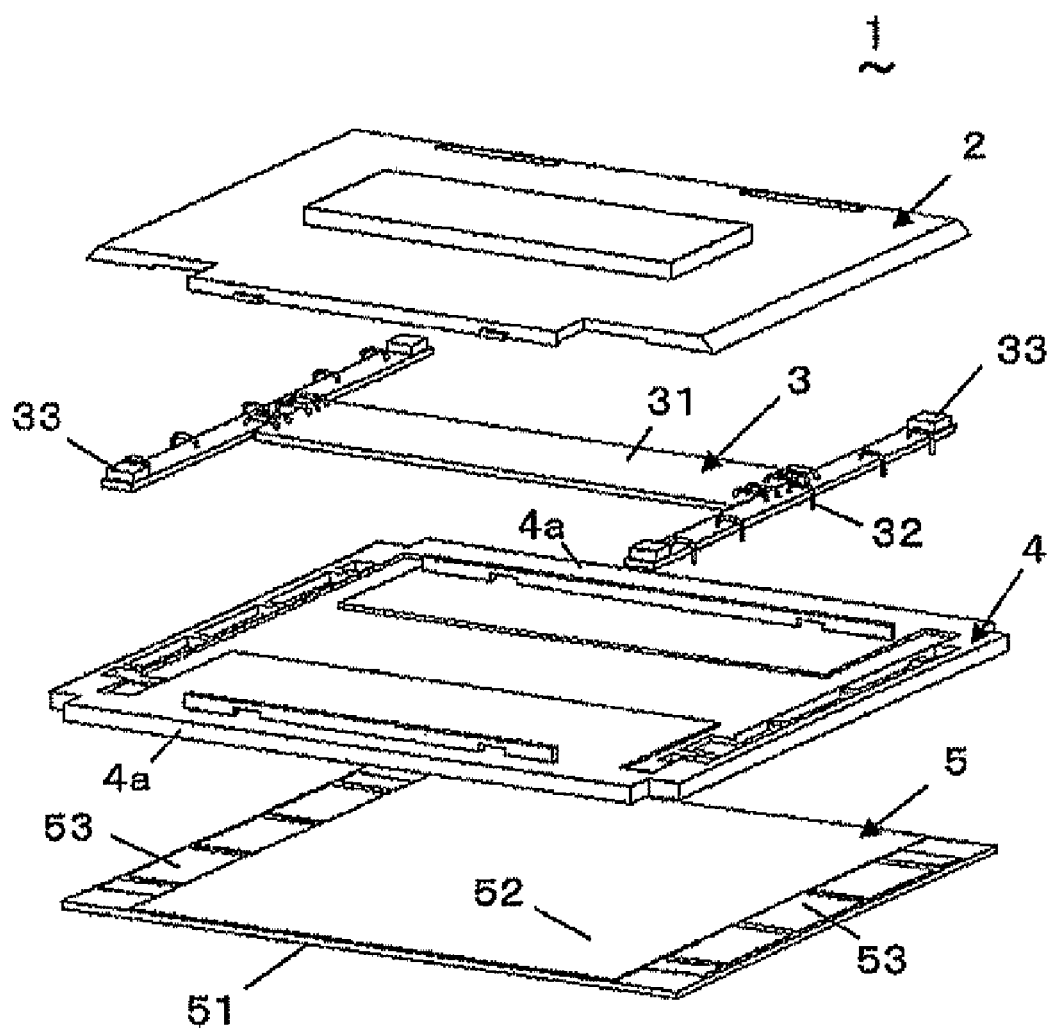
FIG. 1 is an exploded perspective view of an organic EL module in accordance with a first embodiment of the present invention.

The organic EL modules in accordance with the embodiments of the present invention will be described with reference to the accompanying drawings which form a part hereof.

First Embodiment

An organic EL module 1 is formed by accommodating in a casing a combined structure of a thin organic EL panel 5 and a circuit substrate 3 having power supply elements such as a power distribution pattern and the like in order to easily handle the organic EL panel or facilitates supply of power from the outside. Specifically, the organic EL module 1 of the first embodiment includes a cover 2, the circuit substrate 3, the casing 4 and the organic EL panel 5, as shown in FIG. 1.

The cover 2 is insertion-fitted to the casing 4. The circuit substrate 3 is formed by connecting three long substrates in an H-shape when viewed from the top. A power circuit 31 is provided at a central substrate of the circuit substrate 3, and connectors 33 are respectively provided at four end portions of both outer substrates of the circuit substrate 3. The power circuit 31 and the connectors 33 are electrically connected to each other by wiring patterns formed on the substrates and wirings such as a power feed wire and the like. The power circuit 31 is disposed at the inner side of the circuit substrate 3, and the wirings 32 from the circuit substrate 3 to the electrode terminals 53 of the organic EL panel 5 are disposed at both outer substrates. Due to this configuration of the circuit substrate 3, the end portions of the circuit substrate 3 can become thin, and the organic EL module 1 itself can become thin.

Figure 2:
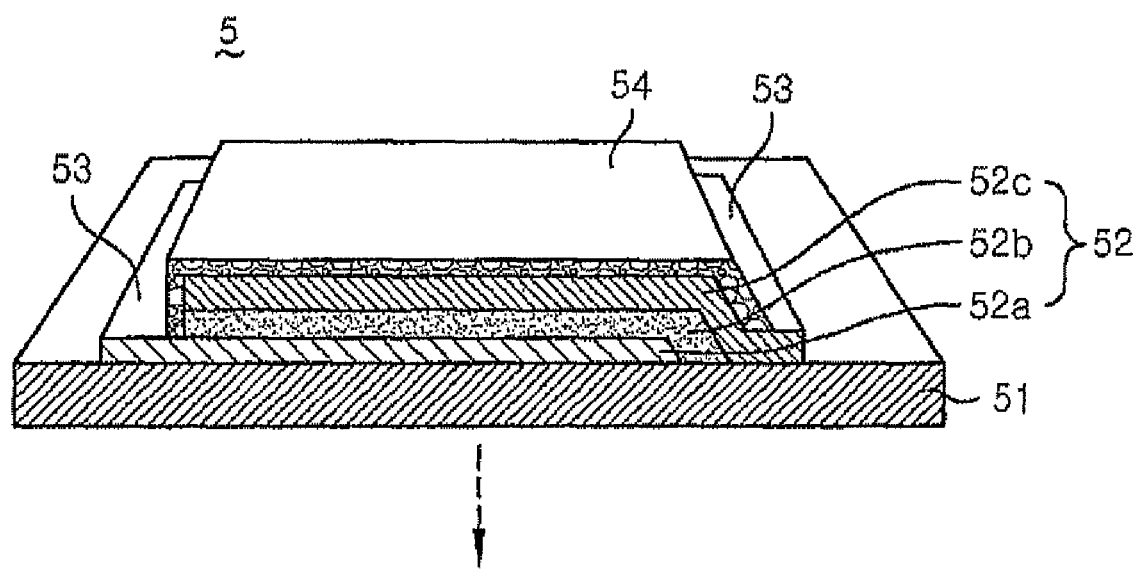
FIG. 2 schematically shows a structure of an organic EL panel.

Each of the connectors 33 includes a transmission side connector and a reception side connector. The external power is input to the power circuit 31 via the reception side connector, and is output to the outside via the transmission side connector. The output of the power circuit 31 is supplied to the opposite electrode terminals 53 of the organic EL panel 5 via the wirings 32 such as a power feed wire and the like. As shown in FIG. 2 schematically showing the structure of the organic EL panel 5, the electrode terminals 53 are electrically connected to an anode electrode 52*a* and a cathode electrode 52*c* of the organic EL panel 5. The wirings 32 are connected by wire bonding to the electrode terminals 53 of the organic EL panel 5.

As can be seen from FIG. 1, the casing 4 accommodates the circuit substrate 3 and the organic EL panel 5 in the upper and lower sides thereof, respectively. Further, an extended portion 4*a* is protruded by a predetermined width w from a side surface (each of the opposite side surfaces in this embodiment) of the casing 4 where the electrode terminals 53 of the organic EL panel 5 are not disposed (see FIG. 4). Preferably, the predetermined width w is wide enough (e.g., about 1 to 3 cm) for an operator to hold the extended portions 4*a*.

As shown in FIG. 2, the organic EL panel 5 includes a transparent substrate 51 made of a glass substrate, a plastic film or the like, a light emitting unit 52, and electrode terminals 53 to which power from the circuit substrate 3 is supplied. The light emitting unit 52 has an anode electrode layer 52*a* made of ITO (Indium Tin Oxide) or the like, a light emitting layer 52*b* made of an organic compound, and a cathode electrode layer 52*c*, e.g., a metal electrode. The light emitting unit 52 is airtightly sealed by a sealing material 54 made of sheet-shaped copper or the like, and the electrode terminals 53 are formed in a state where the anode electrode layer 52*a* and the cathode electrode layer 52*c* are partially exposed from the sealing material 54.

Figure 3A:
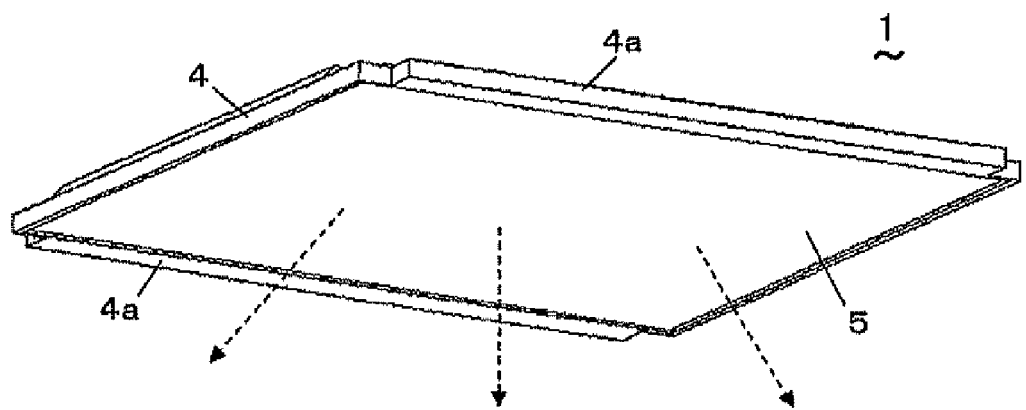
FIG. 3A is a perspective view of the organic EL module viewed from the bottom.
Figure 3B:
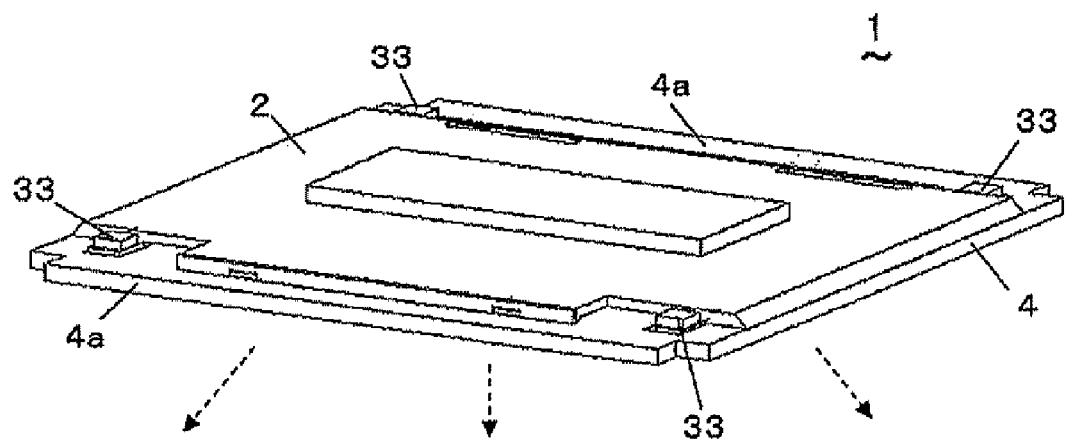
FIG. 3B is a perspective view of the organic EL module viewed from the top.

In the casing 4 of the organic EL module 1 which is assembled as shown in FIGS. 3A and 3B, the extended portions 4*a* protruding by the predetermined width are formed at the opposite sides of the casing 4, and light is emitted from the organic EL panel 5 as a light emitting surface.

Figure 4:
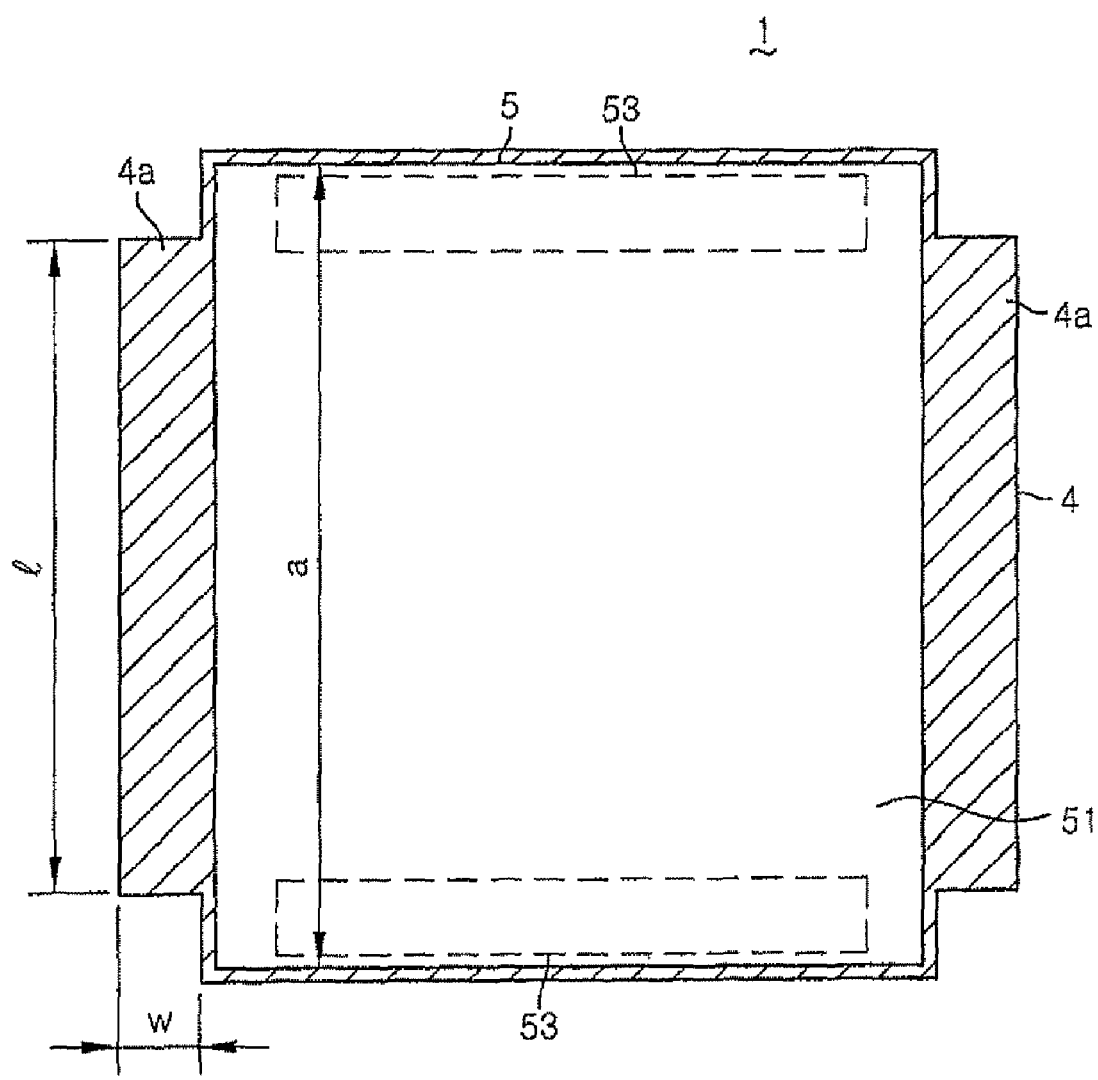
FIG. 4 is a top view of the organic EL module viewed from the side of a light emitting surface.

As shown in FIG. 4, in the organic EL module 1 of the first embodiment, the electrode terminals 53 are provided at the opposite short sides of the substantially rectangular organic EL panel 5, and the extended portions 4*a* having a length l shorter than a length a of the long sides of the organic EL panel 5 are respectively formed at central portions of the opposite side surfaces of the casing 4 where the electrode terminals 53 of the organic EL panel 5 are not disposed. In other words, the length l of the extended portions 4*a* along the long sides of the organic EL panel 5 is shorter than the entire length a of the long sides of the organic EL panel 5.

With this configuration, the operator can hold the extended portions 4*a* when handling the organic EL module 1. As a consequence, it is possible to prevent damages to the electrode terminals 53 or the wirings 32, breakage of the light emitting surface of the organic EL panel 5, attachment of contaminant or the like.

Figure 5:
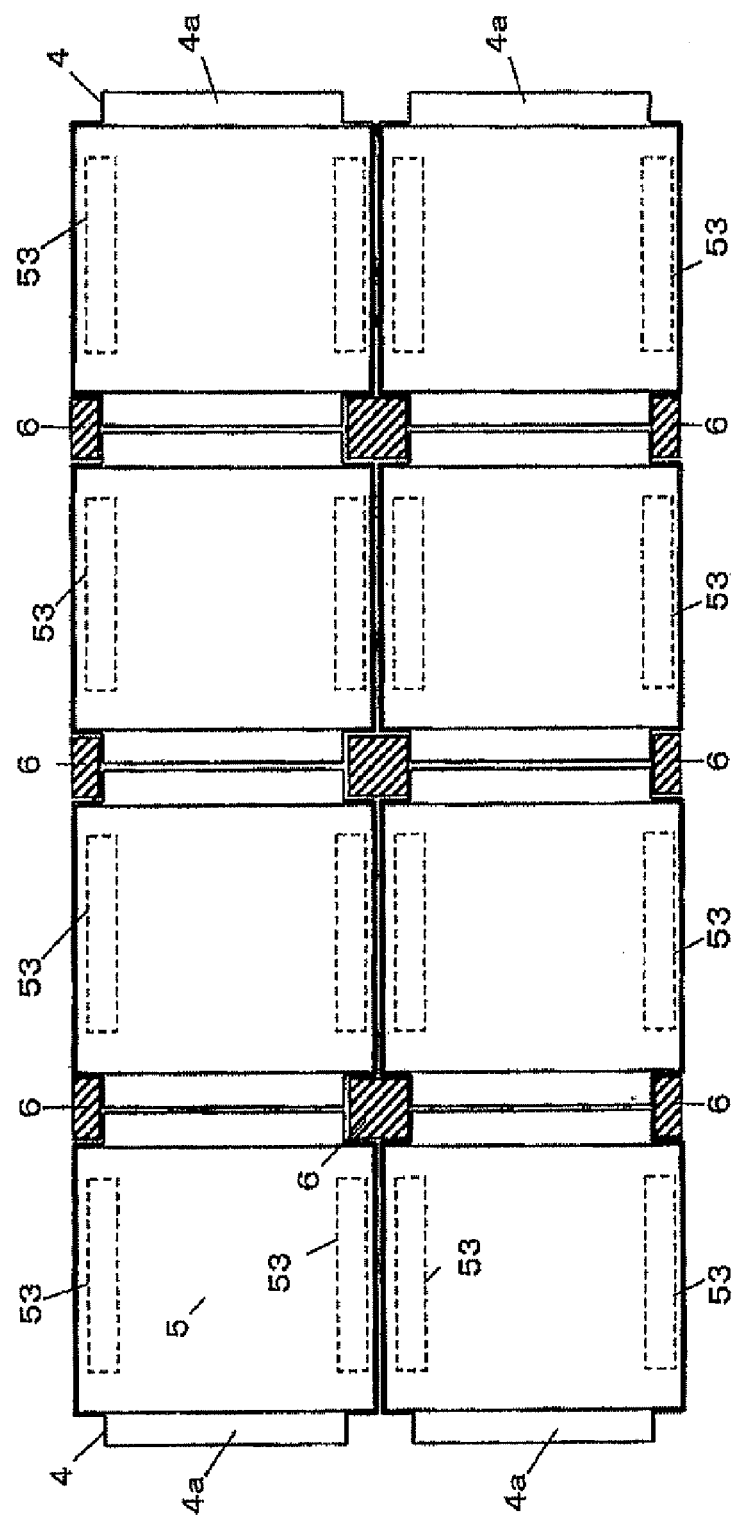
FIG. 5 is a top view of an illumination device having a plurality of organic EL modules which is viewed from the side of the organic EL panel.

As shown in FIG. 5, due to the presence of the extended portions 4*a*, cutoff portions for positioning are respectively formed at the corner portions of the organic EL module 1. By fitting the cutoff portions to positioning protrusions 6 formed at the frame of the illumination device having a plurality of organic EL modules 1, the organic EL modules 1 can be extremely easily arranged.

Figure 6:
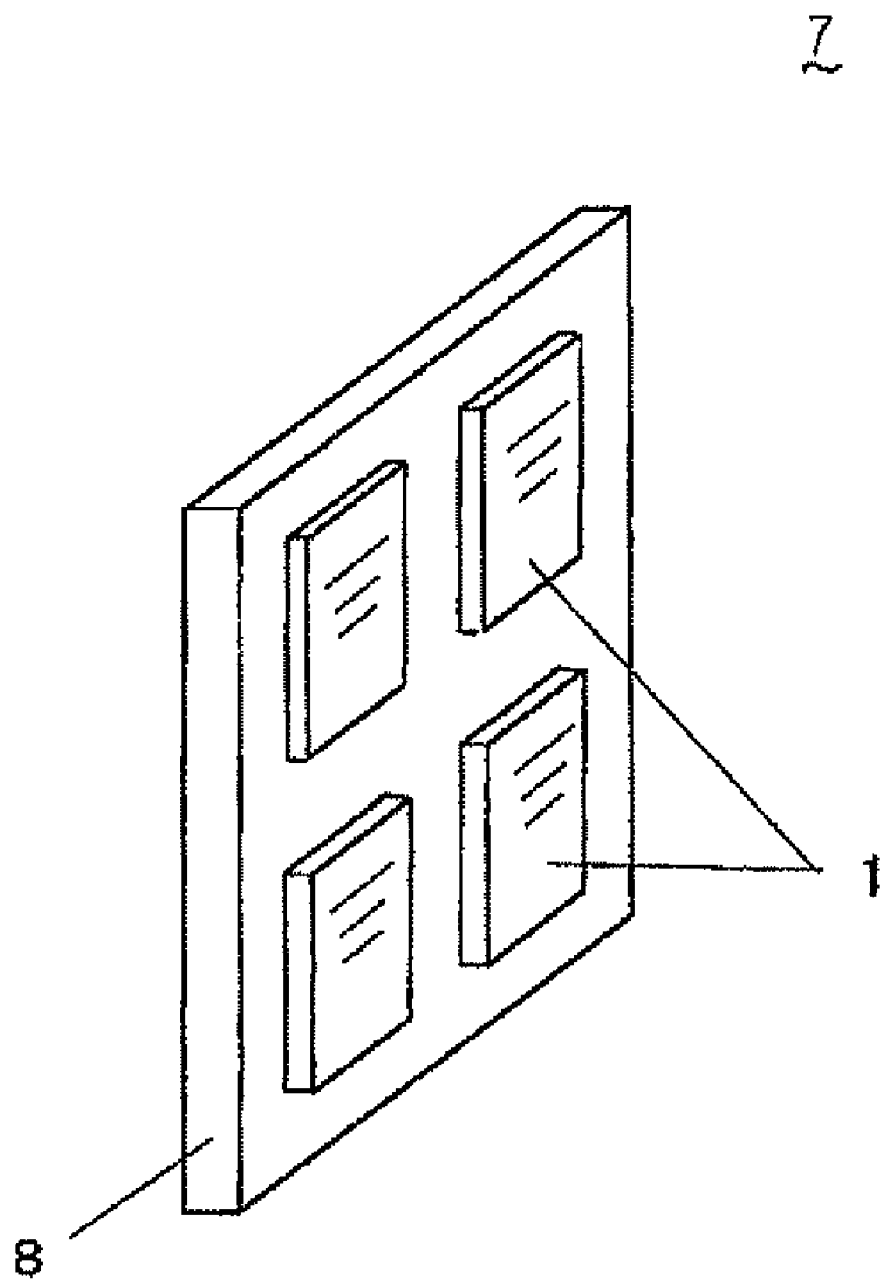
FIG. 6 is a perspective view of an illumination device having a plurality of organic EL modules 1.

The illumination device 7 shown in FIG. 6 includes the frame 8 to which a plurality of organic EL modules 1 are fitted and four organic EL modules 1. Moreover, the illumination device 7 receives power from a power supply unit (not shown) and serves as a lighting device using an organic EL light emitting device.

As described above, in the organic EL module 1 of the first embodiment, the extended portions 4*a* formed at the casing 4 serve as handle portions, so that the operator can hold the extended portions 4*a* when handling the organic EL module 1. Accordingly, it is possible to protect the wirings 32 from damages caused when the operator holds the vicinity of the electrode terminals 53 and prevent contamination of the organic EL panel 5 with fingerprints. Besides, due to the shape of the extended portions 4*a*, the positioning of the organic EL modules 1 can be facilitated when the organic EL modules 1 are arranged in the frame 8 of the illumination device 7.

In the organic EL module of the present embodiment, the organic EL panel 5 is attached in the lower portion of the casing 4. However, the combined structure of the organic EL panel 5 and the circuit substrate 3 can be accommodated in a rectangular parallelepiped casing having a transparent light transmitting unit for transmitting light emitted from the organic EL panel 5.

Further, in the present embodiment, the power circuit 31 is provided at the circuit substrate 3. However, a power circuit provided separately from the organic EL module may be connected by a suitable electrical connection unit to the circuit substrate 3 of the organic EL module which has a wiring pattern formed thereon.

Although the extended portions 4a are formed at both sides of the casing 4 in the present embodiment, the extended portion 4a may be formed at one side of the casing 4.

Second Embodiment

Figure 7:
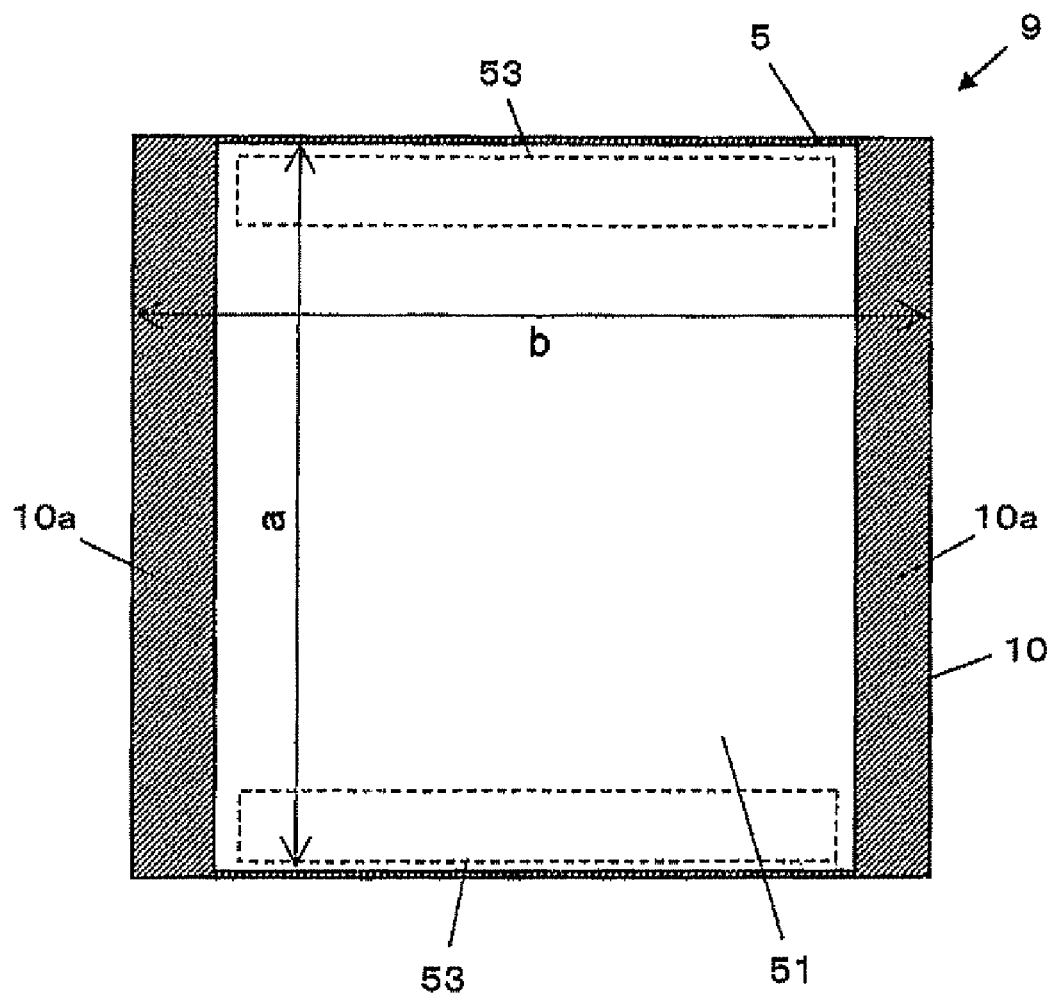
FIG. 7 is a top view of an organic EL module in accordance with a second embodiment of the present invention which is viewed from the side of a light emitting surface.

An organic EL module in accordance with a second embodiment of the present invention will be described with reference to FIG. 7. As shown in FIG. 7, in an organic EL module 9, extended portions 10a are formed at the side surfaces of the casing 4 where the electrode terminals 53 of the organic EL panel 5 are not disposed over the entire length thereof. Accordingly, a length a of the long sides of the organic EL panel 5 becomes equal to a width b of the casing 4, and the organic EL module 9 has a substantially square shape when viewed from the top.

In the organic EL module 9 of the second embodiment, the damages to the wirings 32 or the contamination of the organic EL panel 5 with fingerprints can be prevented. Besides, the design feature is improved because a plurality of organic EL modules 9 arranged in the illumination device has a substantially square shape when viewed from the top.

Third Embodiment

Figure 8:
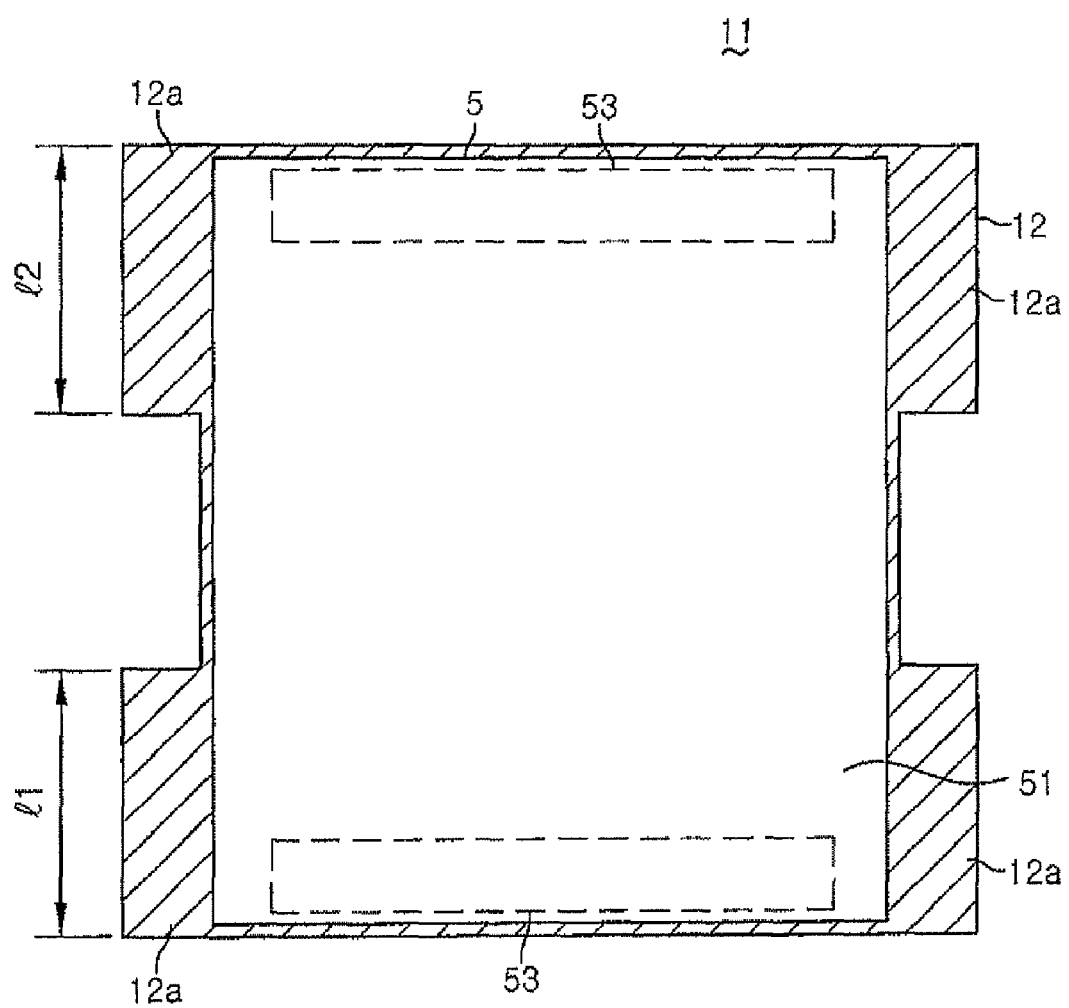
FIG. 8 is a top view of an organic EL module in accordance with a third embodiment of the present invention which is viewed from the side of a light emitting surface.

An organic EL module 11 in accordance with a third embodiment of the present invention will be described with reference to FIGS. 8 and 9. As shown in FIG. 8, extended portions 12a having a predetermined width are formed at both end portions of each side surface of a casing 12 where the electrode terminals 53 of the organic EL panel 5 are not disposed 2. The length (l1+l2) of the extended portions 12a along the long sides of the organic EL panel 5 is shorter than the entire length a of the long sides of the organic EL panel 5.

Figure 9:
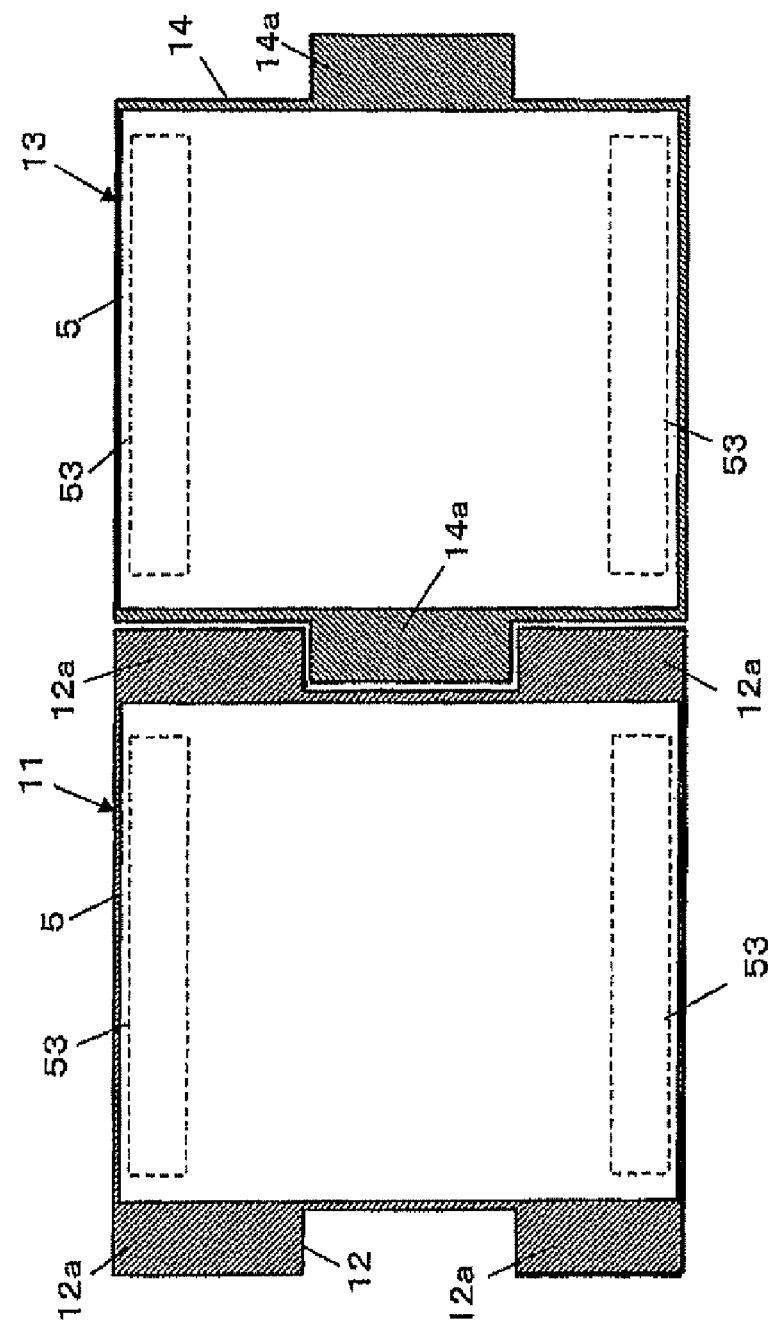
FIG. 9 is a top view of an illumination device having a plurality of organic EL modules which is viewed from the side of a light emitting surface.

As shown in FIG. 9, by combining the organic EL module 11 and the organic EL module 13 of the first embodiment, the extended portions 12a and 14a can be engaged with each other like a puzzle, and the positioning of a plurality of organic EL modules can be facilitated.

As described above, in the organic EL module 11 of the third embodiment, the extended portions 12a can serve as handle portions used for an operator to handle the organic EL module 11 and facilitate the positioning of a plurality of organic EL modules forming the illumination device.

Fourth Embodiment

Figure 10:
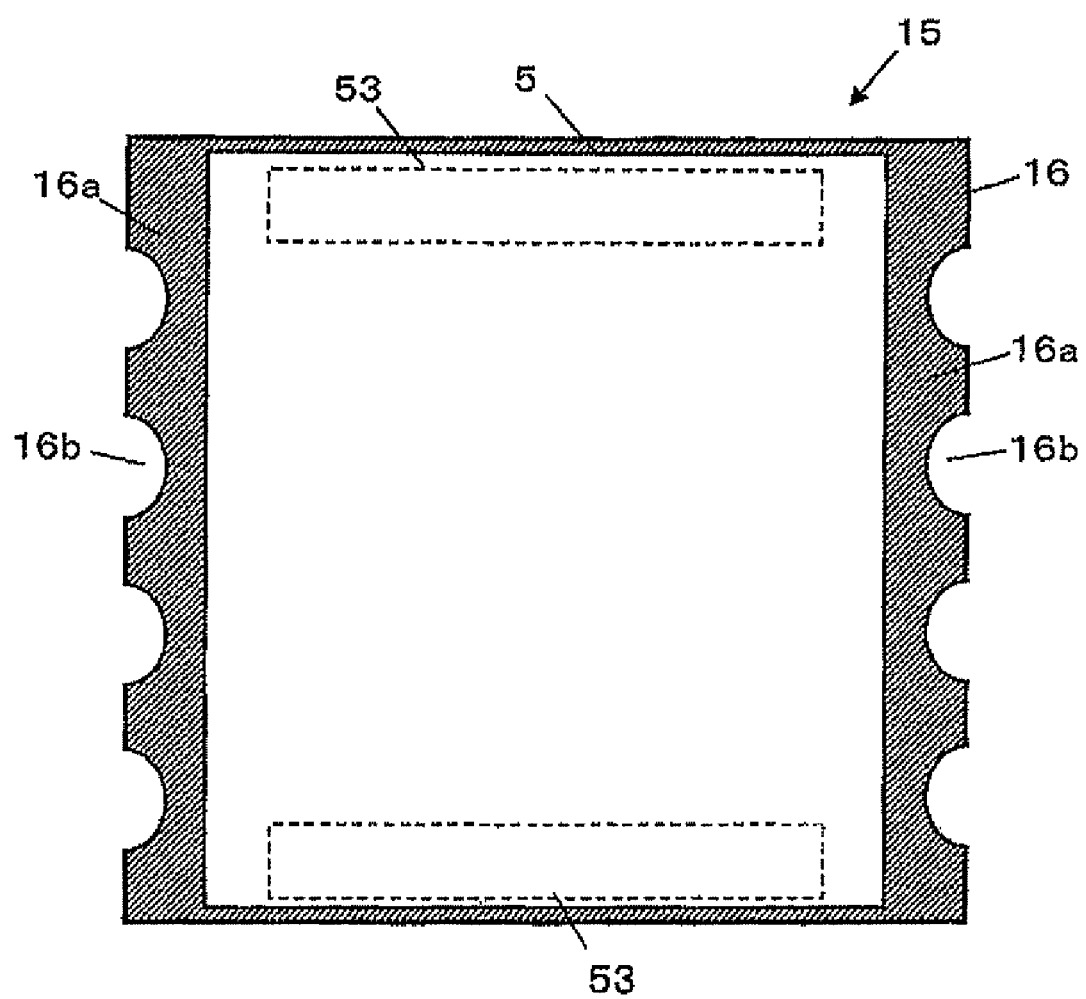
FIG. 10 is a top view of an organic EL module in accordance with a fourth embodiment of the present invention which is viewed from the side of a light emitting surface.

An organic EL module in accordance with a fourth embodiment of the present invention will be described with reference to FIG. 10. As shown in FIG. 10, in an organic EL module 15 of the fourth embodiment, a plurality of recesses 16b that are curved to match the shape of fingers to allow an operator to easily hold the organic EL module 15 are formed at extended portions 16a of a casing 16 along the long sides of the organic EL panel 5. This configuration not only provides the aforementioned effects but also allows an operator to extremely easily handle the organic EL module 15 by using the recesses 16b.

Fifth Embodiment

Figure 11:
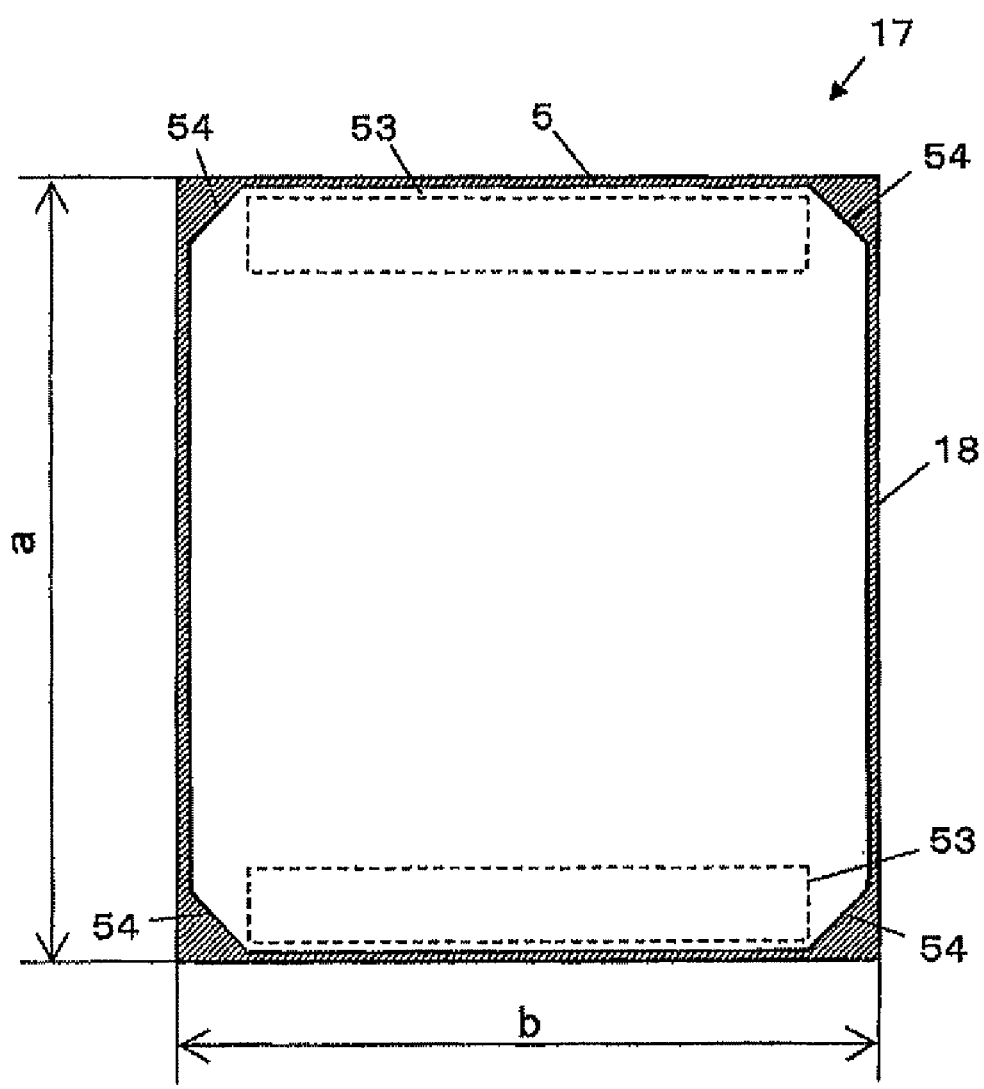
FIG. 11 is a top view of an organic EL module in accordance with a fifth embodiment of the present invention which is viewed from the side of a light emitting surface.

An organic EL module in accordance with a fifth embodiment of the present invention will be described with reference to FIG. 11. As shown in FIG. 11, in an organic EL module 17, cutoff portions 54 are respectively formed at the corner portions of an organic EL panel 5. The cutoff portion 54 may be formed at one or more corner portions of the organic EL panel 5, and the organic EL module 17 may have a substantially square shape when viewed from the top.

In the organic EL module 17 of the fifth embodiment, the cutoff portion 54 is formed at each of the corner portions of the organic EL panel 5, so that the corner portions of a casing 18 where the cutoff portion 54 is disposed serve as handle portions. Since an operator can use the corner portions of the casing 18 as the handle portions, damages to the wirings 32 or contamination of the organic EL panel 5 with fingerprints can be prevented. Moreover, the extended portions of the casing 18 can be reduced or omitted and, thus, an area of a non-light-emitting portion of the organic EL module 17 which does not emit light can be reduced.

The organic EL module of the present invention is not limited to those of the above embodiments, and can be variously modified without departing from the scope of the present invention. Although the organic EL light emitting device is used as a light emitting device in the above embodiments, the present invention can be applied to, e.g., an inorganic EL panel, a light emitting diode, a lighting device that is turned on by a DC current.

In the above embodiments, the electrode terminals 53 connected to the anode electrode layer 52a and the cathode electrode layer 52c are provided at the opposite sides of the organic EL panel 5. However, the electrode terminal 53 may be provided at one side of the organic EL panel 5. In that case, the extended portions 4a may be at least partially formed at the sides of the organic panel where the electrode terminal 53 is not disposed.

Further, in the above embodiments, the electrode terminals 53 are provided at the short sides of the organic EL panel 5. However, the electrode terminals 53 may be provided at the long sides of the organic EL panel 5.

Although the organic EL panel 5 has a rectangular shape in the above embodiments, the organic EL panel may have various shapes other than the rectangular shape.

While the invention has been shown and described with respect to the embodiments, it will be understood by those skilled in the art that various changes and modification may be made without departing from the scope of the invention as defined in the following claims.

What is claimed is:

1. A light emitting module comprising:
a light emitting panel including a light emitting unit formed on a substrate and electrode terminals for supplying power to the light emitting unit;
a circuit substrate, electrically connected to the electrode terminals, for supplying power to the electrode terminals; and
a casing to which the light emitting panel and the circuit substrate are attached,
wherein the electrode terminals are disposed at one or more end portions of the light emitting panel having a substantially rectangular shape when viewed from the top, and extended portions protruding by a predetermined width are at least partially formed at side surfaces of the casing where the electrode terminals of the light emitting panel are absent.

2. The light emitting module of claim 1, wherein the electrode terminals are disposed at the opposite end portions of the light emitting panel.

3. The light emitting module of claim 1, wherein the extended portions formed at the casing make the light emitting module have a substantially square shape when viewed from the top.

4. The light emitting module of claim 1, wherein each of the extended portions is formed at a central portion or both end portions of each of the side surfaces of the casing, and a length of the extended portions along a side of the light emitting panel is shorter than an entire length of the side of the light emitting panel.

5. The light emitting module of claim 1, wherein a cutoff portion is provided at one or more corner portions of the light emitting panel.

6. The light emitting module of claim 1, wherein the light emitting unit is an organic electroluminescence (EL) light emitting unit, and the light emitting panel is an organic EL panel.

7. An illumination device comprising a plurality of the light emitting modules described in any one of claims 1 to 6.

8. The light emitting module of claim 1, wherein the light emitting panel has four sides, and the electrode terminals are disposed at two of the sides and the electrode terminals are absent at the other two of the sides.

9. The light emitting module of claim 1, wherein the circuit substrate is attached to an upper side of the casing and the light emitting panel is attached to a lower side of the casing.

10. The light emitting module of claim 1, wherein a plurality of recesses that is curved to match a shape of fingers is formed at the extended portions of the casing.

11. The light emitting module of claim 5, wherein a corner portion of the casing which corresponds to the cutoff portion of the light emitting panel is exposed and used as a handle portion.

* * * * *